United States Patent
Test et al.

(10) Patent No.: US 7,413,974 B2
(45) Date of Patent: Aug. 19, 2008

(54) COPPER-METALLIZED INTEGRATED CIRCUITS HAVING ELECTROLESS THICK COPPER BOND PADS

(75) Inventors: Howard R. Test, Plano, TX (US); Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 352 days.

(21) Appl. No.: 11/197,002

(22) Filed: Aug. 4, 2005

(65) Prior Publication Data

US 2007/0031697 A1    Feb. 8, 2007

(51) Int. Cl.
- *B32B 15/04* (2006.01)
- *B32B 15/20* (2006.01)
- *H01L 21/28* (2006.01)
- *H01L 21/44* (2006.01)

(52) U.S. Cl. .................. 438/614; 438/612; 438/618; 438/652; 438/687; 428/610; 428/620; 428/670; 428/672; 428/673; 428/674; 428/680

(58) Field of Classification Search ................ 428/610, 428/615, 620, 674, 680, 670, 672, 673, 215, 428/216, 336; 438/612, 614, 618, 652, 687
See application file for complete search history.

(56) References Cited

U.S. PATENT DOCUMENTS

2005/0023688 A1*  2/2005  Park et al. ................ 257/758

\* cited by examiner

*Primary Examiner*—Michael La Villa
(74) *Attorney, Agent, or Firm*—Tum Thach; Wade J. Brady, III; Frederick J. Telecky, Jr.

(57) ABSTRACT

A metal structure (100) for a contact pad of a semiconductor, which has interconnecting traces of a first copper layer (102). The substrate is protected by an insulating overcoat (104). The first copper layer of first thickness and first crystallite size is selectively exposed by a window (110) in the insulating overcoat. A second copper layer (105) of second thickness covers conformably the exposed first copper layer. The second layer is deposited by an electroless process and consists of a transition zone, adjoining the first layer and having copper crystallites of a second size, and a main zone having crystallites of the first size. The distance a void can migrate from the second layer is smaller than the combined thicknesses of the first and second layers. A nickel layer (106) is on the second copper layer, and a noble metal layer (107) is on the nickel layer.

9 Claims, 2 Drawing Sheets

COPPER-METALLIZED INTEGRATED CIRCUITS HAVING ELECTROLESS THICK COPPER BOND PADS

FIELD OF THE INVENTION

The present invention is related in general to the field of metallurgical systems with application to electronic systems and semiconductor devices and more specifically to structure and methods for integrated circuit contact pads of copper-metallized integrated circuits.

DESCRIPTION OF THE RELATED ART

It is a continuing trend in the semiconductor industry to miniaturize integrated circuits (ICs). As a consequence of this trend, the RC time constant of the interconnection between active circuit elements increasingly dominates the achievable IC speed-power product. Consequently, there is a strong need to replace the relatively high impedance of the interconnecting aluminum metallization by the lower impedance of metals such as copper.

For IC bond pads made of copper, the formation of thin copper(I)oxide films during the manufacturing process flow severely inhibits reliable attachment of bonding wires, especially for conventional gold-wire ball bonding. In contrast to aluminum oxide films overlying metallic aluminum, copper oxide films overlying metallic copper cannot easily be broken by a combination of thermo-compression and ultrasonic energy applied in the bonding process. As further difficulty, bare copper bond pads are susceptible to corrosion.

In order to overcome these problems, the industry favors a process, in which a layer of aluminum is formed as a cap over the copper bond pad; this process re-constructs in principle the traditional situation of an aluminum pad, for which the conventional gold-wire ball bonding is well controlled. This process, though, has a number of drawbacks such as added cost and the risk of inadvertent scratching or smearing of the aluminum, causing electrical shorts.

Alternative processes based on the concept of depositing layers of nickel, palladium, and gold on the copper, which are reliably bondable, have until now run into technical problems, such as insufficient adhesion among the various metal layers and insulating materials, unexpected corrosion and chemical undercuts, or void formation with long-term risks of opens in fine interconnecting copper lines. Specifically, plating issues have been encountered when bare copper bond pads are plated electrolessly with layers of nickel and of palladium, followed by a layer of immersion gold. Notable among these issues are: widely varying nickel layer thickness, when the copper surface condition is variable; voids in the copper bond pad caused by the process of palladium surface activation for the copper; and undercut, or crevice, corrosion of the copper under the protective overcoat during the palladium activation and plating.

SUMMARY OF THE INVENTION

Applicants recognize a need for a straightforward solution to create a metallurgical bond pad structure suitable for ICs having copper interconnection metallization, which combines a low-cost method of fabricating the bond pad structure with high reliability in operating the structure, in particular with reduced possibility of void formation and corrosion. It is a technical advantage that the bond pad structure and the method of fabrication are flexible enough to be applied for different IC product families and a wide spectrum of design and process variations. Preferably, these innovations should be accomplished while shortening production cycle time and increasing throughput and yield, and without the need of expensive additional manufacturing equipment.

One embodiment of the invention is a metal structure for a contact pad of a semiconductor device, which has interconnecting traces of a first copper layer. The device is protected by an insulating overcoat. In the structure, the first copper layer of first thickness and first crystallite size is selectively exposed by a window in the insulating overcoat. A layer of second copper of second thickness covers conformally the exposed first copper layer. This second copper layer has a transition zone, adjoining the first layer and consisting of copper crystallites of a second size, and a main zone having crystallites of the first size. The second thickness is selected so that the distance a void from the second layer can migrate during the life expectancy of the metal structure is smaller than the combined thicknesses of the first and second layers. A layer of nickel is on the second copper layer, and a layer of noble metal is on the nickel layer. The noble metal may be palladium, or gold, or a palladium layer with an outermost gold layer.

Another embodiment of the invention is a method for fabricating a metal structure for a contact pad of a semiconductor device, which has copper interconnecting traces of a first copper layer of a first thickness. The substrate is protected by an insulating overcoat. First, a window is opened in the insulating overcoat to selectively expose a portion of the first copper layer. A layer of second copper is then deposited on the exposed portion of the first copper layer by an electroless plating technique; the second layer has a second thickness. This second thickness is selected so that the distance a void from the second layer can migrate within the life expectancy of the metal structure is smaller than the combined thicknesses of the first and second layers. Thereafter, the second copper is activated by exposing it to an acetic palladium chloride solution so that a controlled portion of the second copper is substituted by palladium. A layer of nickel is then deposited on the second copper layer, again by electroless plating. Finally, a layer of noble metal is deposited on the nickel layer.

Embodiments of the present invention are related to wire-bonded IC assemblies, semiconductor device packages, surface mount and chip-scale packages. Other embodiments are related to interconnecting wiring boards. It is a technical advantage that the invention offers a low-cost method of sealing the bond pad against moisture and delamination, and thus for protecting the integrated circuit against corrosion and stress-related contact failure. A further technical advantage includes the uniform copper surface produced by electroless plating, enabling a controlled uniform nickel layer thickness.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 2 depicts the opening of a window in the insulating overcoat to expose a portion of the first copper layer.

FIG. 3 depicts the deposition of a second copper layer on the exposed portion of the first copper layer.

FIG. 4 depicts the deposition of a nickel layer on the second copper layer.

FIG. 5 illustrates the deposition of a noble metal layer on the nickel layer.

DETAILED DESCRIPTION OF THE PREFERRED EMBODIMENTS

Figure 1:
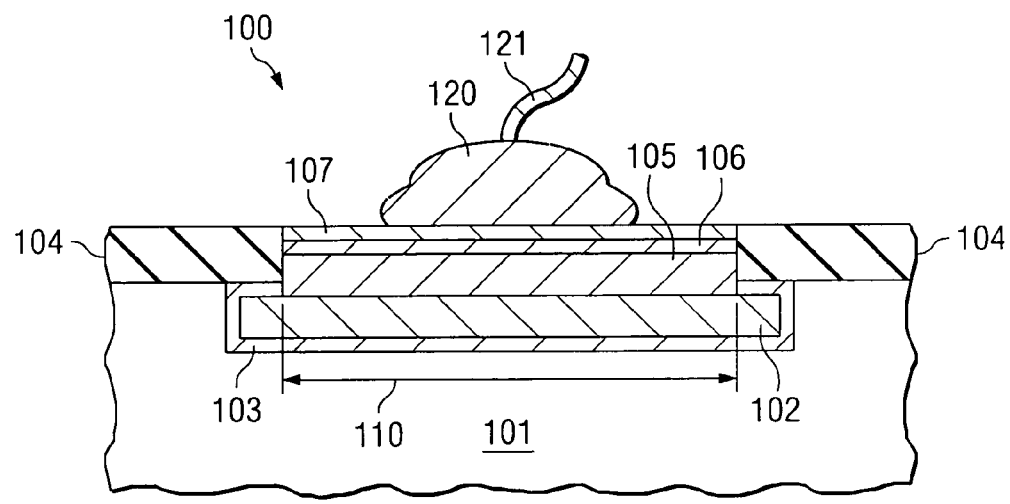
FIG. 1 is a schematic cross section of a bonded contact pad illustrating a preferred embodiment of the invention.

The schematic cross section of FIG. 1 illustrates a bond pad generally designated 100 of a semiconductor device, completed according to the process flow of the invention and with a wire bond attached. A semiconductor chip 101 has interconnecting traces 102 made of a first copper layer. For an integrated circuit, first copper layer 102 has preferably a thickness (first thickness) in the range from about 0.2 to 1.0 µm. In order to prevent outdiffusion of the copper, trace 102 is preferably surrounded by a barrier metal layer 103. Barrier metal layer 103 is typically tantalum nitride in the thickness range from about 20 to 50 nm. Semiconductor chip 101 is protected by an insulating overcoat 104, typically made of silicon nitride, silicon oxynitride, silicon carbide, polyimide, or stacks of these or related insulators; a preferred thickness range is from about 0.5 to 1.0 µm.

As FIG. 1 shows, trace 102 of the first copper layer is selectively exposed by the window 110 in the insulating overcoat 104. Adherent to the first copper layer 102 is layer 105 of a second copper, which conformally covers the first copper layer 102 exposed by window 110. The thickness (second thickness) range of second copper layer 105 is preferably from about 0.2 to 2.0 µm.

The preferred method for depositing the first copper layer 102 is electroplating (an electrochemical deposition process). The copper crystallites in this layer vary in size (and shape); the approximate average size is about 0.5 µm. This crystallite size range is referred to herein as the first crystallite size. The second copper layer 105 is deposited by an electroless technique. With regard to crystallite sizes, second copper layer exhibits two zones. For about 70 to 90% of the layer thickness, the copper crystallites have an approximate average size of about 0.5 µm, already called the first crystallite size. However, layer 105 exhibits a transition zone of about 10 to 30% of the layer thickness, which adjoins the first copper layer 102; in the transition zone, the crystallites exhibit smaller than 0.5 µm average dimensions, herein referred to as the second crystallite size.

Adherent to second copper layer 105 is a layer 106 of nickel, which is preferably deposited by an electroless process in the thickness range from about 0.2 to 0.5 µm. Since the copper of layer 105 is deposited by an electroless process, the surface condition of layer 106 is not variable, but well controlled. Consequently, the nickel plating results are tightly controllable, especially the nickel layer thickness.

Adherent to nickel layer 106 is a layer 107 of noble metal. Preferably this noble metal is palladium in the thickness range from about 100 to 300 nm. Alternatively, it may be gold about 50 to 120 nm thick, or it may be a stack of a palladium layer with an outermost layer of gold.

Layer 107 of noble metal is bondable by wire ball bonding. FIG. 1 shows schematically a ball 120 formed of wire 121 and welded to noble metal layer 107, preferably by an automated and commercially available wire bonder. Preferably, wire 121 and ball 120 are made of gold, but metals such as copper and aluminum have also been used.

Figure 2:
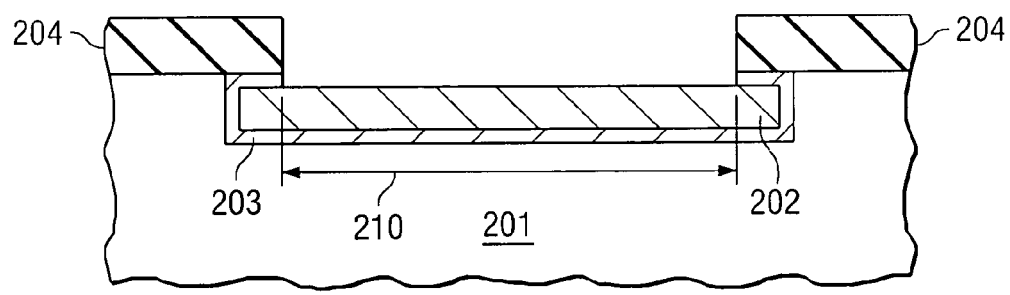
FIGS. 2 to 5 are schematic cross sections illustrating certain steps of the process flow for the fabrication of a bond pad on an integrated circuit wafer.
Figure 3:
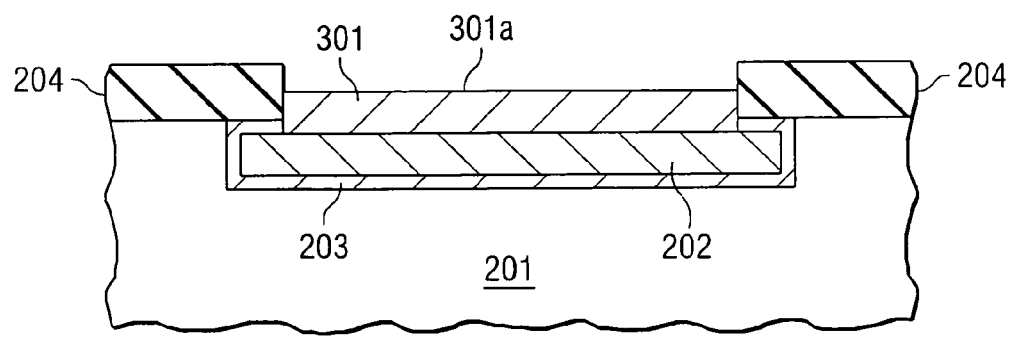

Another embodiment of the invention is a method for fabricating a metal structure for a contact pad of a device, which has interconnecting traces of a first copper layer with a first thickness. The substrate is protected by an insulating overcoat. Certain process steps are illustrated in the schematic cross sections of FIGS. 2 to 5. In FIG. 2, the substrate is designated 201 and the trace of the first copper layer is designated 202. The first copper is deposited by an electroplating process. To prevent outdiffusion of copper into the surrounding semiconductor or insulator 201, copper layer 202 is embedded by a barrier layer 203, preferably made of tantalum nitride in the thickness range from about 20 to 50 nm. An insulating overcoat 204 protects the surface of substrate 201 and portions of first copper trace 202. A preferred overcoat material is silicon nitride or silicon oxynitride.

The process flow starts by opening a window of width 210 in overcoat 204 to selectively expose a portion of the first copper metallization trace. In the next process step, depicted in FIG. 3, an electroless technique is used to deposit the second copper metal layer 301 on the exposed portion of the first copper layer. As stated above, this deposition technique renders the copper surface 301a controllable and reproducible.

The thickness of the second copper layer 301, referred to herein as the second thickness, is selected so that the distance a void from the second layer 301 can migrate within the life expectancy of the metal structure is smaller than the combined first and second thicknesses.

A later process step needed for the electroless deposition of a nickel layer (palladium surface activation, see below) may indeed create voids in the second copper layer 301. Voids of small diameter may display a displacement phenomenon ("migrate") as a function of temperature and the crystallite structure of the copper layers similar to the well known (and feared) electromigration phenomenon in metal traces. With the thickness of the copper layer 301 selected as stated above, there is no risk that any voids may travel through both copper layers 301 and 202 to reach a small-scale critical circuit node and cause an electrical open circuit.

In the next process step, second copper layer 301 is activated by exposing it to an acetic palladium chloride solution so that a controlled portion of layer 301 is substituted by palladium (on the order of 50 ppm). The resulting palladium film on copper has a thickness of only few nanometers, but represents an enhanced surface energy for the copper. However, the activation process carries the risk of forming voids in the copper.

Figure 4:
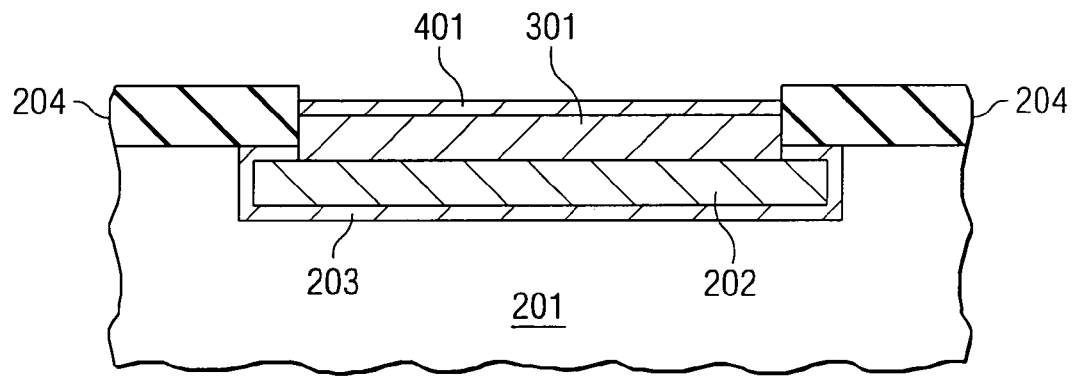

The deposition of the additional metal layers for completing the bond pad structure is performed using electroless plating techniques. In FIG. 4, a nickel layer 401 is electrolessly plated on the activated copper layer 301. Nickel layer 401 is uniform, adherent to copper layer 401, and is preferably between about 0.2 and 0.5 µm thick.

Figure 5:
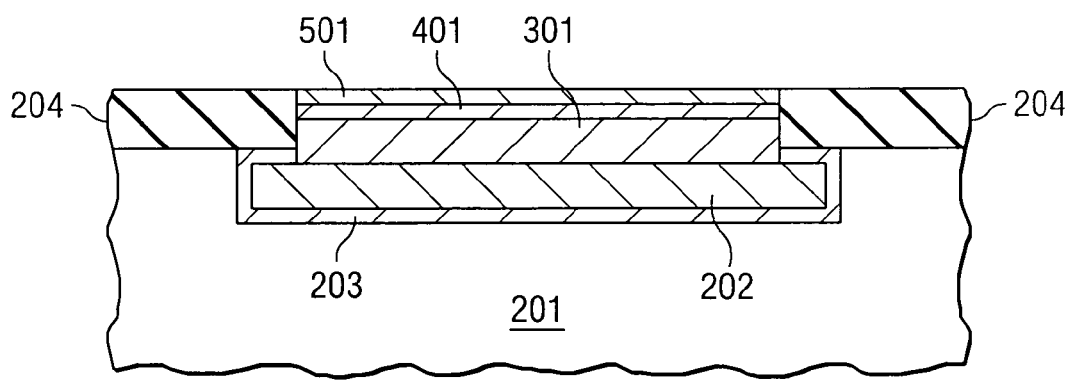

Finally in FIG. 5, a layer 501 of noble metal is electrolessly plated on nickel layer 401. Preferably, noble metal layer is made of palladium in the thickness range from about 100 to 300 nm. The palladium layer 501 adheres well to the underlying nickel layer 401.

In many embodiments, though, an additional gold layer in the thickness range from about 10 to 40 nm is formed on top of the palladium layer to be the outermost layer of the structure. The preferred method is an immersion technique wherein the wafer is immersed into a gold-containing solution so that the top palladium atoms are exchanged for gold atoms.

In other embodiments, the noble metal layer 501 in FIG. 5 consists of gold. The preferred deposition technique for this gold layer is an electroless plating step on the nickel layer 401.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in semiconductor wafers as well as in insulating substrates, which have copper interconnecting metallization yet need to be bondable using conventional ball or ribbon bonding. As another example, the material of the semiconductor material may comprise silicon, silicon germanium, gallium arsenide, or any other semiconductor or compound material used in IC manufacturing. As yet another example, the concept of the invention is effective for many semiconductor device technology nodes and not restricted to a particular one. It is therefore intended that the appended claims encompass any such modifications or embodiments.

We claim:

1. A metal structure for a contact pad of a semiconductor device having interconnecting traces of a first copper layer, the device protected by an insulating overcoat, comprising:

the first copper layer of first thickness and first crystallite size selectively exposed by a window in the insulating overcoat;

a second copper layer of second thickness conformally covering the exposed first copper layer, the second layer consisting of a transition zone, adjoining the first layer and having crystallites of a second size, and a main zone having crystallites of the first size;

the second thickness selected so that the distance a void from the second layer can migrate during the life expectancy of the metal structure is smaller than the combined thicknesses of the first and second layers;

a layer of nickel on the second copper layer; and a layer of noble metal, wherein said noble metal is selected from the group consisting of palladium, platinum, silver, gold, or a combination thereof, on the nickel layer.

2. The structure according to claim 1 wherein the first copper layer has a thickness in the range of about 0.2 to 1.0 µm.

3. The structure according to claim 1 wherein the second copper layer has a thickness in the range from about 0.2 to 2.0 µm.

4. The structure according to claim 1 wherein the nickel layer has a thickness from about 0.2 to 0.5 µm.

5. The structure according to claim 1 wherein the noble metal is palladium.

6. The structure according to claim 5 wherein the palladium layer has a thickness from about 100 to 300 nm.

7. The structure according to claim 1 wherein the noble metal is gold.

8. The structure according to claim 7 wherein the gold layer has a thickness from about 10 to 40 nm.

9. The structure according to claim 1 wherein the noble layer metal consists of a palladium layer adherent to the nickel layer and an outermost gold layer adherent to the palladium layer.

* * * * *